United States Patent [19]

Omata

[11] Patent Number: 4,616,130
[45] Date of Patent: Oct. 7, 1986

[54] PROJECTION EXPOSURE APPARATUS

[75] Inventor: Takashi Omata, Yokosuka, Japan

[73] Assignee: Canon Kabushiki Kaisha, Tokyo, Japan

[21] Appl. No.: 722,015

[22] Filed: Apr. 11, 1985

[30] Foreign Application Priority Data

Apr. 19, 1984 [JA] Japan .................. 59-79008

[51] Int. Cl.$^4$ ............ G01J 1/20; H01J 3/14; H01J 40/14
[52] U.S. Cl. ............... 250/201; 250/215; 250/548 250/237 R; 356/401
[58] Field of Search ........... 250/200, 201, 215, 216, 250/221, 222.1, 237 R, 237 G; 356/150, 400, 401

[56] References Cited

U.S. PATENT DOCUMENTS 3,897,138  7/1975  Kano ................ 350/183
4,492,459  1/1985  Omata ............... 355/43

FOREIGN PATENT DOCUMENTS 110234  9/1981  Japan .

OTHER PUBLICATIONS

Jorgensen, R. R. et al, "Mask-to-Wafer Alignment Using Exposure Wavelength", *IBM Technical Disclosure Bulletin*, vol. 18, No. 2, Jul. 1975, pp. 385–386.

*Primary Examiner*—Eugene R. LaRoche
*Assistant Examiner*—D. C. Mis
*Attorney, Agent, or Firm*—Fitzpatrick, Cella, Harper & Scinto

[57] ABSTRACT

A projection exposure apparatus for projecting, onto a semiconductor wafer through a projection lens, an integrated circuit pattern formed on a mask or reticle. An alignment beam having a wavelength different from that for the exposure is used to achieve alignment between the mask and the wafer. A parallel flat plate is detachably disposed between the projection lens and the mask and/or the wafer to prevent a magnification error and/or a focus error of the projection lens which would otherwise be caused upon alignment due to the difference in wavelength.

5 Claims, 4 Drawing Figures

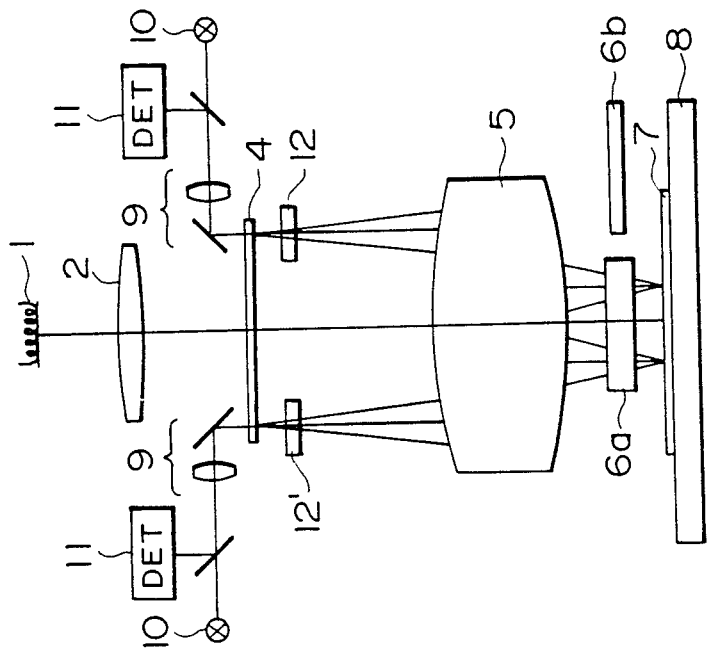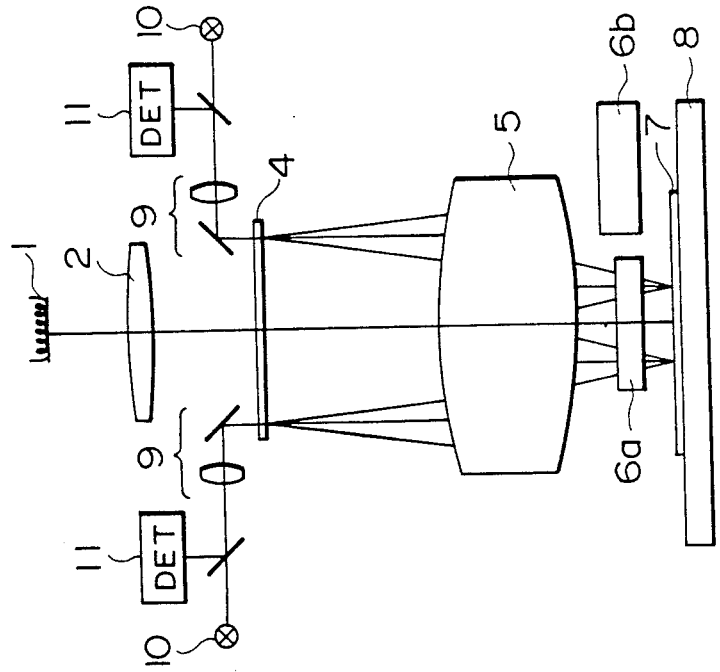

PROJECTION EXPOSURE APPARATUS

BACKGROUND OF THE INVENTION

This invention relates to an exposure apparatus and, more particularly, to a projection exposure apparatus for projecting a pattern formed on an object such as a photomask or a reticle (which hereinafter will be referred to simply as "mask") onto another object such as a semiconductor wafer having a photoresist layer and for aligning the mask with the wafer at a high accuracy.

Recent demands for higher capacities of circuits in semiconductor devices have forced dramatic development of step-and-repeat type exposure apparatuses having high-resolution projection lenses for printing integrated circuit patterns onto semiconductor wafers. The projection lens employed in the step-and-repeat type exposure apparatus usually has a relatively small view field of the order of $10 \times 10 - 15 \times 15$ mm$^2$. For this reason, to transfer the integrated circuit pattern onto the entire surface of the wafer having a 5 or 6 inch diameter requires a large number of repetitions of alignment between the mask and the wafer and exposure of the wafer. Therefore, in order to improve the throughput of the apparatus employing the step-and-repeat system, how to achieve high-speed and high-accuracy alignment is one of the critical problems. The high-accuracy alignment can be most stably attained in a case where the system is arranged to view an alignment mark or pattern through the projection lens for pattern printing. In such case, it is desirable to use different wavelengths for the exposure and for the alignment. For example, a deep ultraviolet beam supplied by a super Hg lamp is used for the exposure while a laser beam providing high-luminance illumination is used for the automatic alignment. Alternatively, in order to prevent sensitization of the resist material by the alignment beam, a wavelength which is different from that for the exposure and to which the resist material is insensitive is used for the alignment.

Where different wavelengths are used for the exposure and for the alignment, it may be necessary to employ a projection lens system in which aberrations are corrected with respect to both of the exposure wavelength $\lambda 1$ and the alignment wavelength $\lambda 2$. In such case, the dependence of the focus position on the wavelength has a characteristic such as shown in FIG. 3 wherein the abscissa designates the focus position while the ordinate designates the wavelength. It is seen in FIG. 3 that the portion of the curve across the wavelength $\lambda 1$ shows a steep inclination. This means that, while the wavelengths $\lambda 1$ and $\lambda 2$ define the same correct focus position, a wavelength which is deviated from the wavelength $\lambda 1$, even if the deviation is only through a minute amount, would cause a large displacement of the focus position. If the expansion of the spectrum of the light supplied from the light source for the exposure is large, the imaging performance of the projection lens is remarkably deteriorated. As a solution for preventing this, the aberration-correction for the projection lens may be effected so as to provide a focus position curve as denoted by A in FIG. 4 to thereby prevent a large focus displacement due to the wavelength deviation. In such case, however, the focus position with respect to the alignment wavelength $\lambda 2$ disadvantageously displaces by a great amount. In order to prevent this, the wafer may be moved vertically upon alignment so that the alignment beam is focused accurately on the wafer surface. However, this tends to cause horizontal displacement of the wafer which makes it quite difficult to maintain the alignment accuracies.

The same assignee of the subject application has already proposed in U.S. Pat. No. 3,897,138 an interchangeable lens arrangement wherein a part of the element lenses of the projection lens system is replaced by an additional element lens to compensate for the focus displacement due to the difference in wavelength between the exposure beam and the alignment beam. While this arrangement shows satisfactory results, there still remains anxiety about deterioration, in stability, with age because to interchange the element lenses while preventing deviation from its place, inclination and misalignment with the optical axis and to frequently repeat the interchange such as in a case of a step-and-repeat type exposure apparatus would impose a substantial burden on the mechanism. On the other hand, there has been proposed to execute the alignment without the projection lens and at a station other than the exposure station. From the viewpoint of accuracies, however, it is preferable to effect alignment through the projection lens. In view of this, a proposal has been made in IBM Technical Disclosure Bulletin, Vol. 18, No. 2, July 1975, pages 385 and 386, to use the same wavelength for the alignment beam and the exposure beam and to employ an arrangement to prevent the area on the wafer, onto which the actual device pattern is to be transferred, from being exposed by the alignment beam. Use of the same wavelength however involves inconveniences. That is, in a case where the photoresist layer shows a high absorption factor with respect to the exposure wavelength, the amount of alignment beam coming back from the wafer decreases which makes it difficult to achieve alignment.

SUMMARY OF THE INVENTION

It is accordingly a primary object of the present invention to provide a projection exposure apparatus capable of achieving high-speed and high-accuracy detection for the alignment between a mask and a wafer while using a wavelength different from that for the exposure.

Briefly, according to the present invention, there is provided a projection exposure apparatus for projecting, onto a semiconductor wafer through a projection lens, an integrated circuit pattern formed on a mask or reticle. An alignment beam having a wavelength different from that for the exposure is used to achieve alignment between the mask and the wafer. A parallel flat plate is detachably disposed between the projection lens and the mask and/or the wafer to prevent a magnification error and/or a focus error of the projection lens which would otherwise be caused upon alignment due to the difference in wavelength.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view showing a projection exposure apparatus according to an embodiment of the present invention.

FIG. 2 is a schematic view showing a projection exposure apparatus according to another embodiment of the present invention.

DESCRIPTION OF THE PREFERRED EMBODIMENTS

Figure 3:
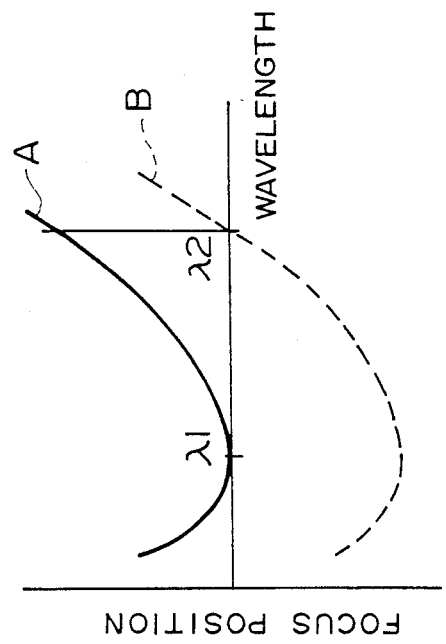
FIG. 3 is a graph showing the relation between the wavelength and the focus position in a projection lens in which aberrations are corrected with respect to both of a wavelength in a range exposing the resist material and a wavelength in a range not exposing the resist material.

Referring to FIG. 1, there is shown a projection exposure apparatus according to an embodiment of the present invention, which includes a light source 1 such as a super Hg lamp for supplying a light beam for exposing a resist material, an illumination optical system 2 for uniformly illuminating, with a light beam emitted from the light source 1, a mask 4 having formed thereon a circuit pattern for the manufacture of integrated circuits, as well as alignment marks at the left-hand and right-hand sides thereof, and a projection optical system 5 such as, for example, a reduction projection lens for imaging on a wafer 7 the pattern of the mask 4. The wafer 7 is coated with a photoresist material. The projection exposure apparatus further includes two interchangeable focus-correcting optical elements 6a and 6b each consisting of, for example, a parallel flat plate. A selected one of the focus-correcting optical elements, 6a in FIG. 1 case, is detachably interposed in the projection optical path, particularly between the projection optical system 5 and the wafer 7. As will be described later, the thickness of each of the focus-correcting optical elements 6a and 6b is determined so that the focus position defined when the optical element 6a, which is a thinner one, is introduced relative to the alignment wavelength coincides with the focus position defined when the optical element 6b, which is a thicker one, is introduced relative to the exposure wavelength.

The wafer 7 has formed thereon alignment marks corresponding to those formed on the mask 4. A stage 8 carries thereon the wafer 7 and is movable for the sake of alignment between the mask 4 and the wafer 7 and for the sake of step-and-repeat movement. The apparatus further includes alignment optical systems 9—9, alignment beam sources 10—10 such as He-Ne lasers for providing laser beams of a wavelength in a range to which the resist material on the wafer 7 is insensitive, and photoelectric detecting devices 11—11 for detecting positional deviation between the alignment marks.

With the combination of the alignment beam sources 10—10 and the alignment optical systems 9—9, the alignment marks on the mask 4 and the wafer 7 are detected or viewed through the projection optical system 5 and the optical element 6a and, on the basis of the results of which, the mask 4 and/or the stage 8 is moved so that the mask 4 and the wafer 7 are placed in alignment. In order to assure high-accuracy alignment, the mask surface and the wafer surface each having formed thereon the alignment marks are so disposed as to definitly establish therebetween an optically conjugate positional relation with respect to an optical system comprising the projection optical system 5 and the optical element 6a. Upon completion of alignment, the optical element 6a is moved out of the optical path and, in substitution therefor, the optical element 6b is introduced into the optical path. Subsequently, an unshown shutter blade is opened so that the mask 4 is illuminated by the light beam emitted from the light source 1 for the exposure and passed through the illumination optical system 2, whereby the circuit pattern of the mask 4 is transferred onto the wafer 7.

As described in the foregoing, each of the optical elements 6a and 6b may be formed by a parallel flat plate. Where the difference in thickness between the optical elements 6a and 6b is Δd and the refractive index of each of the optical elements is N, to interchange the optical elements 6a and 6b (parallel flat plates) is effective to correct or displace the focus position by an amount ΔS as given by the following equation:

$$\Delta S = (N-1)/N \times \Delta d \quad (1)$$

Figure 4:
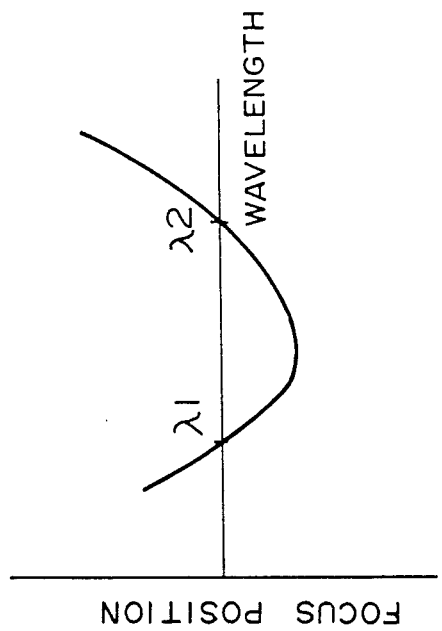
FIG. 4 is a graph showing the relation between the wavelength and the focus position in a projection lens employed in a projection exposure apparatus according to the present invention.

This is well known. According to this equation, the difference in thickness between the parallel flat plates 6a and 6b is determined so as to correct the focus error caused by the difference between the exposure wavelength λ1 and the alignment wavelength λ2. The dependence of the focus position upon the wavelength is shown in the graph of FIG. 4. In this Figure, the curve A shows the characteristic upon exposure, while the curve B shows the characteristic upon alignment. It is seen from this Figure that, upon the exposure as well as upon the alignment, the mask surface and the wafer surface can be maintained in an exactly optically conjugate positional relation. By this, pattern transfer with a high resolution is attainable. Since the parallel flat plate has such a property that displacements thereof in the direction of the optical axis and in the direction perpendicular to the optical axis would not at all affect the imaging performance of the optical system, high positional accuracies are not required to interchange the optical elements 6a and 6b. Accordingly, a highspeed interchanging operation is attainable which leads to an increase in the throughput of the apparatus.

The focus-correcting optical element may be disposed between the projection optical system and the mask. Since, however, in the case of reduction projection, the optical path difference provided by the two optical elements is proportional to the square of the reciprocal of the reduction ratio, the parallel flat plate must has a large thickness. Further, the field of transfer at the mask side is substantially greater than that at the wafer side. From the viewpoint of ease of interchange, therefore, it is preferable to dispose the focus-correcting optical element between the projection optical system and the wafer. Of course, the thinner one of the optical elements may be omitted.

While in the foregoing embodiment the focus error can be corrected in the manner as described above, there still remains a magnification error. That is, due to the difference in wavelength, there also occurs a minute amount of displacement or deviation of the image of each alignment mark, of the mask 4, as projected on the wafer 7 from the regular position in a radial direction with respect to the optical axis of the projection optical system 5 and in a plane perpendicular to the optical axis. In order to meet this, each of the alignment marks for the mask 4 is preparatively formed on the mask at a position which is deviated from the regular position by a predetermined amount. As an alternative, the photoelectric detecting device may be preparatively adjusted so that an alignment signal is produced while taking into account a determined amount of deviation. In view of the versatility of the mask and the alignment accuracies, however, the applicant now proposes the following embodiment.

FIG. 2 shows a projection exposure apparatus according to another embodiment of the present invention. The projection exposure apparatus of this embodiment includes magnification-adjusting optical elements 12 and 12', for alignment optical sytems 9—9, which are disposed between a mask 4 and a projection optical system 5, respectively. Except for this point, the apparatus of the FIG. 2 embodiment has essentially the same structure as of the FIG. 1 embodiment, the elements corresponding to those of the FIG. 1 apparatus being designated by similar reference numerals. Each of the magnification-adjusting optical elements 12 and 12' is formed by a parallel flat plate, as an example. In such case, the amount of displacement Y(mm) of the image in the horizontal direction, i.e. in the radial direction with respect to the projection optical system 5 and in a plane perpendicular to the optical axis thereof, can be given by the following equation:

$$Y = (N-1)/N \times d \times \theta \quad (2)$$

wherein N is the refractive index of the parallel flat plate, d is the thickness (mm) of the parallel flat plate and $\theta$ is the angle of inclination (radian) of the parallel flat plate. Thus, by adjusting the inclination angle $\theta$ of the parallel flat plate, a magnification exactly the same as that of the exposure optical sytem is achieved in the alignment optical system. As the result, a high overlay accuracy is attainable.

Where each of the magnification-adjusting optical elements 12 and 12' is disposed out of the region through which the imaging beam forming an image of the actual circuit pattern of the mask 4 passes, it may be fixedly secured onto the barrel or the like of the projection optical system 5. If the alignment mark is at a position which is very close to the circuit pattern so that the magnification-adjusting optical element is liable to shade the imaging beam forming the image of the actual circuit pattern, the magnificaiton-adjusting optical elements 12 and 12' may be moved outwardly, upon exposure, in association with the interchanging of the focus-correcting optical elements 6a and 6b. It will be understood that the optical elements 12 and 12' are inclined symmetrically with respect to the optical axis of the projection optical system 5 so as to establish symmetrical displacements of the images of the left-hand and right-hand alignment marks with respect to the optical axis of the projection optical system 5.

In accordance with the present invention, as has hitherto been described, simple and interchangeable optical elements such as parallel flat plates are employed, which allow, without causing any inconveniences, use of an alignment light source providing a wavelength different from that provided by an exposure light source. This realizes a projection exposure apparatus capable of achieving high-resolution and high-accuracy alignment and achieving high-speed exposure operation.

While in the foregoing embodiments, a parallel flat plate having a fixed thickness is detachably inserted into the optical path of the projection optical system, the present invention is not limited to use of such parallel flat plate. That is, the parallel flat plate may be replaced by, for example, a combination of two relatively displaceable wedge-shaped prisms. More specifically, two such prisms are combined to form a parallel flat plate and are disposed in the optical path of the projection optical system. These wedge-shaped prisms are displaced relative to each other to change the thickness of the parallel flat plate (the combined form), as required, to correct the focus position in accordance with the wavelength used.

While the invention has been described with reference to the structures disclosed herein, it is not confined to the details set forth and this patent is intended to cover such modifications or changes as may come within the scope of the following claims.

What is claimed is:

1. A projection exposure apparatus, comprising:
   means for projecting, in a reduced scale, a pattern of a first object onto a second object;
   means for transferring the pattern of the first object onto the second object through said projecting means, said transfering means using light of a predetermined wavelength;
   means for aligning the first object with the second object through said projecting means, said aligning means using a wavelength of light different from that used with said transferring means; and
   means for correcting a focus error of said projecting means with respect to at least one of the wavelengths used with said transferring means and with said aligning means relative to the other, said correcting means having an optical element for changing the optical path length between said projecting means and the second object, said optical element being detachably introduced into the optical path between said projecting means and the second object.

2. An apparatus according to claim 1, wherein said optical element comprises a parallel flat plate.

3. A projection exposure apparatus, comprising:
   means for projecting, in a reduced scale, a pattern of a first object onto a second object;
   means for transferring, through said projecting means, the pattern of the first object onto the second object, said transferring means using light of a predetermined wavelength;
   means for aligning the first object with the second object through said projecting means, said aligning means using a wavelength of light different from that used with said transferring means; and
   means for correcting a magnification error and a focus error of said projecting means with respect to at least one of the wavelengths used with said transferring means and with said aligning means relative to the other, said correcting means having a first optical element for changing the position of an image, to be formed by said projecting means, in a plane perpendicular to the optical axis of said projecting means, and a second optical element for changing the optical path length between said projecting means and the second object, said first optical element being adapted to be disposed between said projecting means and the first object, and said second optical element being detacably introduced into the optical path between said projecting means and the second object.

4. An apparatus according to claim 3, wherein each of said first and second optical elements comprises a parallel flat plate.

5. An apparatus according to claim 4, wherein said first optical element comprises a plurality of parallel flat plates inclined symmetrically with respect to the optical axis of said projecting means.

* * * * *

UNITED STATES PATENT AND TRADEMARK OFFICE
CERTIFICATE OF CORRECTION

PATENT NO. : 4,616,130

DATED : October 7, 1986

INVENTOR(S) : TAKASHI OMATA

It is certified that error appears in the above-identified patent and that said Letters Patent is hereby corrected as shown below:

Column 3, lines 63-64, change "definitly" to --definitely--.

Column 4, line 47, change "has" to --have--.

Column 5, line 41, change "magnificaiton" to --magnification--.

Column 6, line 58, change "detacably" to --detachably--.

Signed and Sealed this

Third Day of February, 1987

Attest:

DONALD J. QUIGG

Attesting Officer

Commissioner of Patents and Trademarks